(12) United States Patent
Suekawa et al.

(10) Patent No.: US 6,999,321 B2
(45) Date of Patent: Feb. 14, 2006

(54) ASSEMBLY FOR TOOLLESS INSTALLATION AND LOCKING OF A PRINTED CIRCUIT CARRIER TO A SYSTEM

(75) Inventors: Mik Suekawa, San Jose, CA (US); Kwang Kim, Santa Clara, CA (US); Bradley D. Blackwood, San Jose, CA (US); Robert Jetter, Dublin, CA (US); Damon Campbell, Vancouver (CA)

(73) Assignee: Hewlett-Packard Development Company, L.P., Houston, TX (US)

( * ) Notice: Subject to any disclaimer, the term of this patent is extended or adjusted under 35 U.S.C. 154(b) by 97 days.

(21) Appl. No.: 10/722,338

(22) Filed: Nov. 25, 2003

(65) Prior Publication Data

US 2005/0111201 A1 May 26, 2005

(51) Int. Cl.
*H05K 7/14* (2006.01)
(52) U.S. Cl. .................. 361/740; 361/732; 361/747; 361/759; 361/801; 361/685
(58) Field of Classification Search ........... 361/726, 361/728, 730, 732, 740, 747, 759, 801, 685, 361/684, 686, 798; 312/222, 223.1, 223.2; 70/85; 174/52.1
See application file for complete search history.

(56) References Cited

U.S. PATENT DOCUMENTS

| 5,684,673 | A | * | 11/1997 | Shibasaki et al. | ........... 361/686 |
| 5,790,373 | A | * | 8/1998 | Kim et al. | ................... 361/685 |
| 6,269,007 | B1 | * | 7/2001 | Pongracz et al. | ........... 361/759 |
| 6,404,641 | B1 | | 6/2002 | Fisk et al. | |
| 6,407,913 | B1 | | 6/2002 | Peachey et al. | |
| 6,490,153 | B1 | * | 12/2002 | Casebolt et al. | ............ 361/685 |
| 6,574,118 | B1 | * | 6/2003 | Russell et al. | .............. 361/807 |
| 6,728,109 | B1 | * | 4/2004 | Wu | ............................ 361/747 |

OTHER PUBLICATIONS

Quantum Corporation & Data Recovery Labs, Inc., The Anatomy of a Hard Drive, http://www.drlabs.com/oldsite/anatomy.htm, pp. 1-2, Jul. 26, 2003, USA.

* cited by examiner

*Primary Examiner*—Kamand Cuneo
*Assistant Examiner*—Dameon E. Levi (57) ABSTRACT

A lock assembly for securing a printed circuit assembly to a housing comprises a pivot point for coupling the lock assembly to the housing and a lock member capable of rotating and snapping into a detent in the printed circuit assembly to hold the printed circuit assembly in place.

20 Claims, 7 Drawing Sheets

ASSEMBLY FOR TOOLLESS INSTALLATION AND LOCKING OF A PRINTED CIRCUIT CARRIER TO A SYSTEM

BACKGROUND OF THE INVENTION

Information storage devices are fundamental building blocks in computing, communications, and data storage. A common information storage device is a hard disk drive, or hard drive, that can generally store large data quantities and enable fast read and write access to stored data. A hard drive stores data on one or more magnetic storage platters that are rotated by a spindle motor using multiple read/write heads. Signals read or written by the head are amplified by one or more preamplifiers. Hard drive internal components are encased in a housing assembly with a cover, and are sealed tightly in a clean room environment. The drive also contains a printed circuit assembly (PCA). The printed circuit assembly houses drive electronics that enable the hard drive to communicate with a processor or controller, and enables synchronous operation of the hard drive components. PCA electronics commonly include a microprocessor that controls drive functions, interface electronics for communicating with the processor's interface bus, a controller application-specific integrated circuit (ASIC) that operates all controller hardware for the drive, a read channel to encode and decode data, and a motor ASIC to drive the motor and actuator coil.

As technology progresses, hard drives have increased density while storing larger data quantities at greater access speed. The increased density of hard drives, and in electronic devices in general, has made assembly and maintenance more difficult. The difficulty of handling and accessing tiny components and devices can increase the time for production and servicing, thereby increasing costs. A particular challenge is the handling and manipulation of tiny hardware, such as screws, that are used to secure parts of electronic devices. Manipulation of tools to engage the hardware increases time and costs of production and maintenance, whether tasks are performed manually or robotically.

SUMMARY

What are desired are structures and components, and associated operating methods, that enable toolless service, and maintenance of electronic devices.

In accordance with an embodiment of a lock assembly for securing a printed circuit assembly to a housing, the lock assembly comprises a pivot point for coupling the lock assembly to the housing, and a lock member capable of rotating and snapping into a detent in the printed circuit assembly to hold the printed circuit assembly in place.

In accordance with other embodiments, an electronic device comprises a housing, and a lock assembly capable of securing a printed circuit assembly to the housing. The lock assembly comprises a pivot point for coupling the lock assembly to the housing, and a lock member that is capable of rotating and snapping into a detent in the printed circuit assembly to hold the printed circuit assembly in place.

In accordance with further embodiments, a method for securing a printed circuit assembly to an electronic device comprises coupling a lock assembly to a housing so that the lock assembly can be rotated between an extended position and a retracted position and providing a printed circuit assembly configuration that is capable of fitting over keyways coupled to the housing. The method further comprises inserting the printed circuit assembly in alignment with the keyways with the lock assembly in the retracted position, and rotating the lock assembly over the printed circuit assembly and securing the printed circuit assembly.

According to additional embodiments, an electronic device comprises means for housing electronic and/or electromechanical components, means for securing a printed circuit assembly to the housing means, means for pivotally coupling the securing means to the housing means so that the securing means can be rotated between an extended position and a retracted position, and means for keying the printed circuit assembly to the housing means.

BRIEF DESCRIPTION OF THE DRAWINGS

Embodiments of the invention relating to both structure and method of operation, may best be understood by referring to the following description and accompanying drawings.

DETAILED DESCRIPTION

Figure 1A:
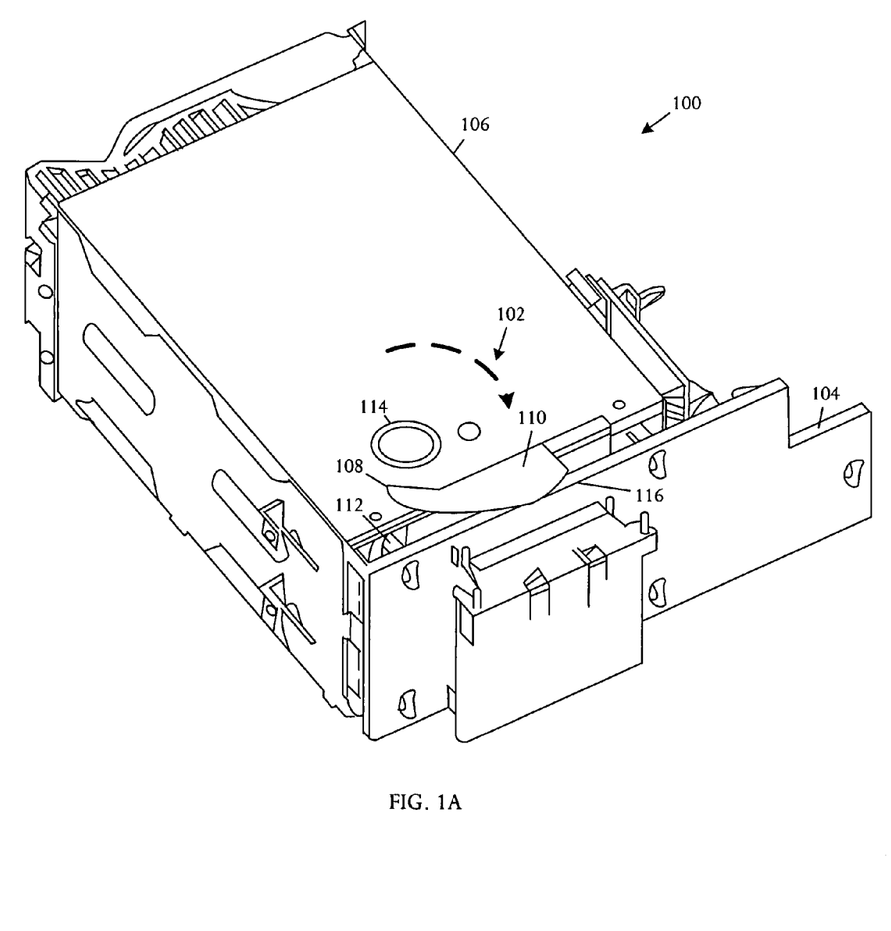
FIGS. 1A, 1B, 1C, and 1D are pictorial diagrams that depict perspective rear/side view, perspective rear/top view, and respective opposing side views illustrating an embodiment of an electronic device utilizing a toolless lock assembly for holding a printed circuit assembly.
Figure 1B:
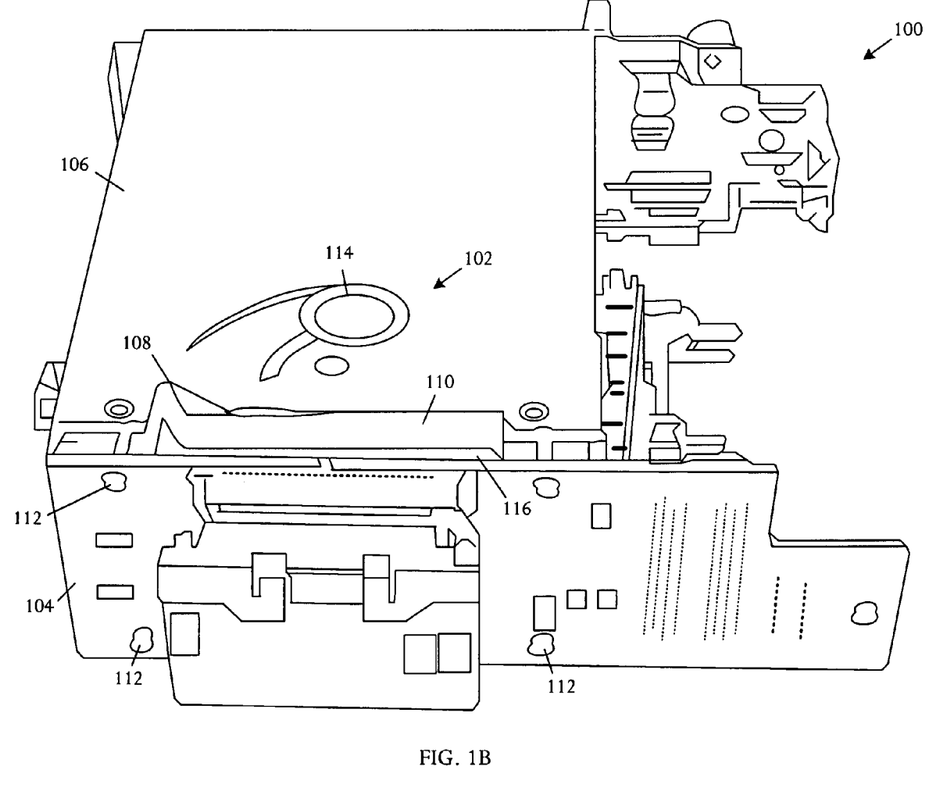
Figure 1C:
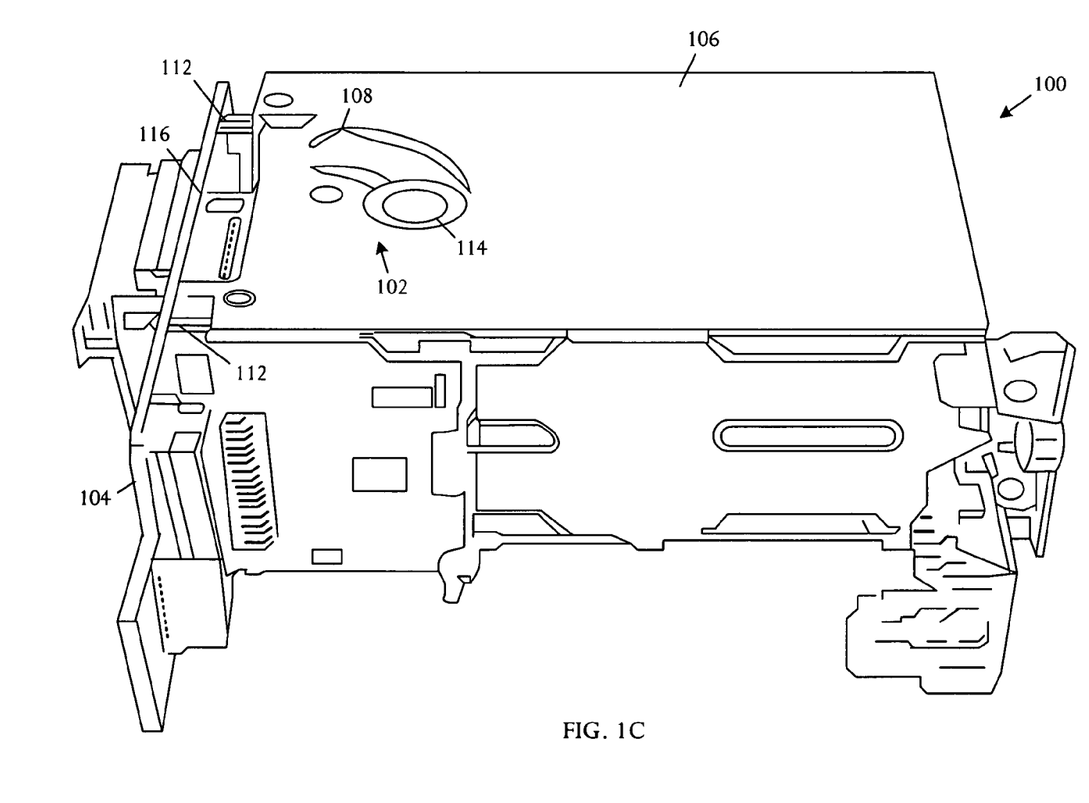
Figure 1D:
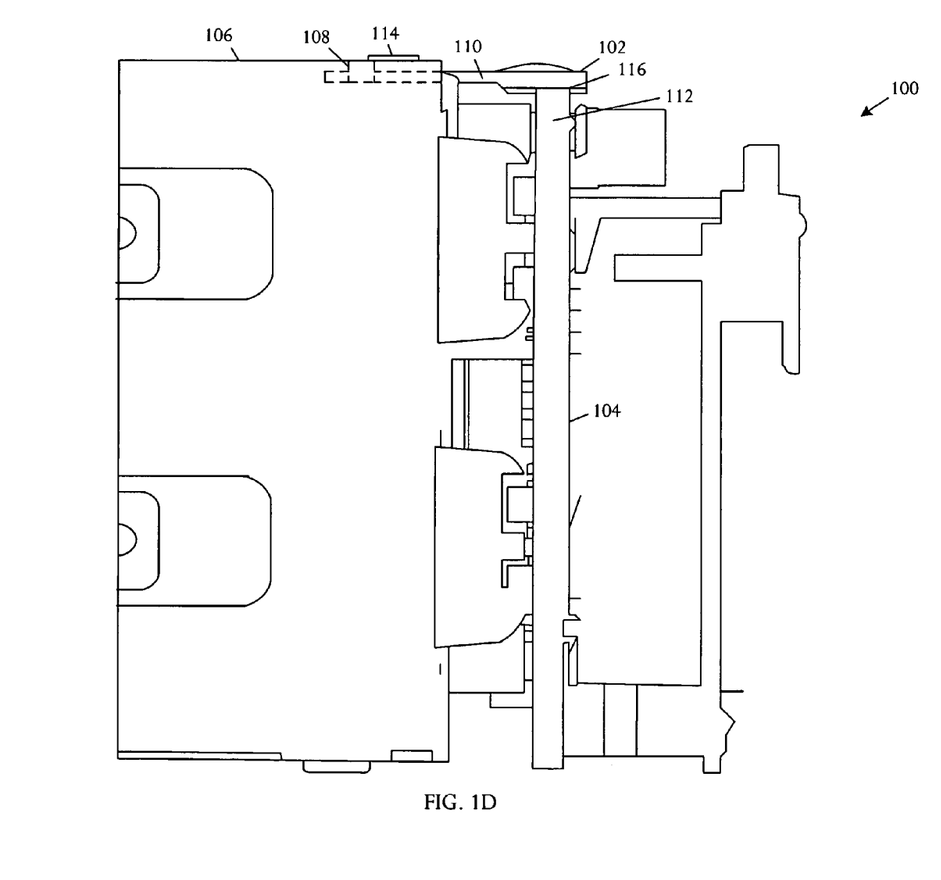

A locking assembly 102 locks a printed circuit assembly (PCA) to a cage, chassis, or housing 106 without using any hardware, for example screws, and consumes a reduced amount of space. A locking member 110, for example constructed from a rigid but flexible material such as sheet metal, rotates over a printed circuit assembly 104 as shown in FIG. 1A, and snaps into a detent 116 in the printed circuit assembly, securing the printed circuit assembly in place within keyways 112 on the rear of an electronic device cage, chassis, or housing 106. In an illustrative example, a suitable electronic device 100 is a hard disk drive, the housing 106 a hard disk drive cage, and the printed circuit assembly 104 a hard disk drive PCA. In the illustrative embodiment, the locking assembly 102 is a piece of sheet metal attached to the hard disk drive cage 106, forming a flexible attachment that enables the locking member 110 to extend over and apply a pre-load to the printed circuit assembly 104.

When the hard disk drive printed circuit assembly 104 is to be removed, the locking member 110 is rotated and unlocked using a finger access detail 114 and the printed circuit assembly 104 can be lifted off the keyways 112 and away from the cage 106.

The structure and operating method enable the hard disk drive printed circuit assembly 104 to lock into place without utilizing screws or other hardware, tools, or additional parts or components. The lock assembly 102 is incorporated into the hard disk drive cage 106 so that loose parts are eliminated that may otherwise be left out of the system or, if improperly installed, cause damage to other system components. The locking assembly 102 can have a finger access detail 114 that enables a user to easily lock and unlock the printed circuit assembly 104 from the system.

The structures and operating methods for using the locking assembly 102 eliminate the need for hardware or tools to lock the printed circuit assembly into place in a location within a system that is typically highly space-constrained.

Generally, electronic components such as hard disk drives are mounted in vertical stacks in a cabinet with little or no space between components.

Elimination of screws or other hardware for securing a printed circuit assembly avoids or eliminates usage of tools within a constrained space, thereby reducing installation and service time, and reducing cost.

Referring to FIGS. 1A, 1B, 1C, and 1D, pictorial diagrams depict perspective rear/side view, perspective rear/top view, and respective opposing side views an embodiment of an electronic device 100 utilizing a toolless lock assembly 102 for holding a printed circuit assembly 104. The electronic device 100 comprises a housing 106, and the lock assembly 102 that is capable of securing the printed circuit assembly 104 to the housing 106. The lock assembly 102 comprises a pivot point 108 for coupling the lock assembly 102 to the housing 106, and a lock member 110 that is capable of rotating and snapping into a detent 116 in the printed circuit assembly 104 to hold the printed circuit assembly 102 in place.

The detent 116 in the printed circuit assembly enables the rotating locking member 110, for example a rotating cam, to lock into place and minimize the possibility or prevent the locking member 110 from loosening or disengaging due to vibration or other motion. The detent 116 assists the compressive force applied by the locking member 110 in securely holding the printed circuit assembly 104 in place.

The electronic device 100 further includes keyways 112 that are formed on the housing 106 and are capable of accepting and seating the printed circuit assembly 104. The keyways 112 have a geometric and topological configuration that is configured and oriented to limit access to the suitably contoured printed circuit assembly structure. Examples of keyways 112 include appropriate grooves or slots for accepting connection members of the printed circuit assembly 104. In other examples, the housing 106 includes extending arms or members that fit within grooves or apertures in the printed circuit assembly. The printed circuit assembly 104 is contoured to fit in the keyways 112 and secured by the lock assembly 102.

In an illustrative embodiment the lock member 110 is constructed from sheet metal and couples to the housing 106 only at the pivot point 108. The sheet metal is rigid but flexible so that the lock assembly 102 applies a pre-load to the printed circuit assembly 104 when the lock assembly 102 is engaged. In some embodiments, including the illustrative embodiment, a finger access detail 114 is formed into the lock member 110 to facilitate grasping the lock member 110 using a finger to engage or disengage the printed circuit assembly 104.

In the illustrative embodiment, all components of the lock assembly 102 are firmly affixed to the housing 106, in particular the pivot point 108 is generally intended for permanent fixture to the lock member 110 and the housing 106, so that no additional parts or hardware are used to secure the printed circuit assembly 104.

In the illustrative embodiment, the housing 106 is a hard disk drive housing and the printed circuit assembly 102 is a hard disk drive printed circuit assembly. The disclosed structures can otherwise be used to secure printed circuit assemblies or cards to housings, chassis, or cages in other types of electronic equipment.

Figure 2A:
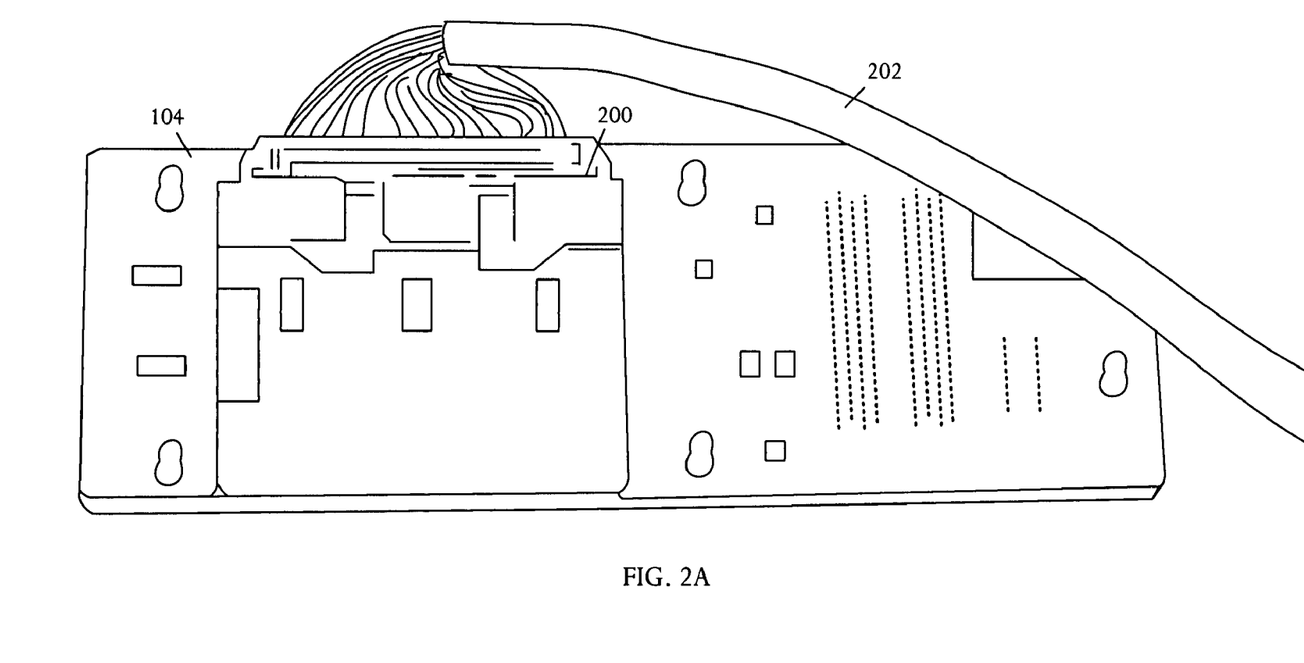
FIGS. 2A and 2B are pictorial diagrams illustrating rear and front views of a printed circuit assembly that can be held using an embodiment of the toolless lock assembly.
Figure 2B:
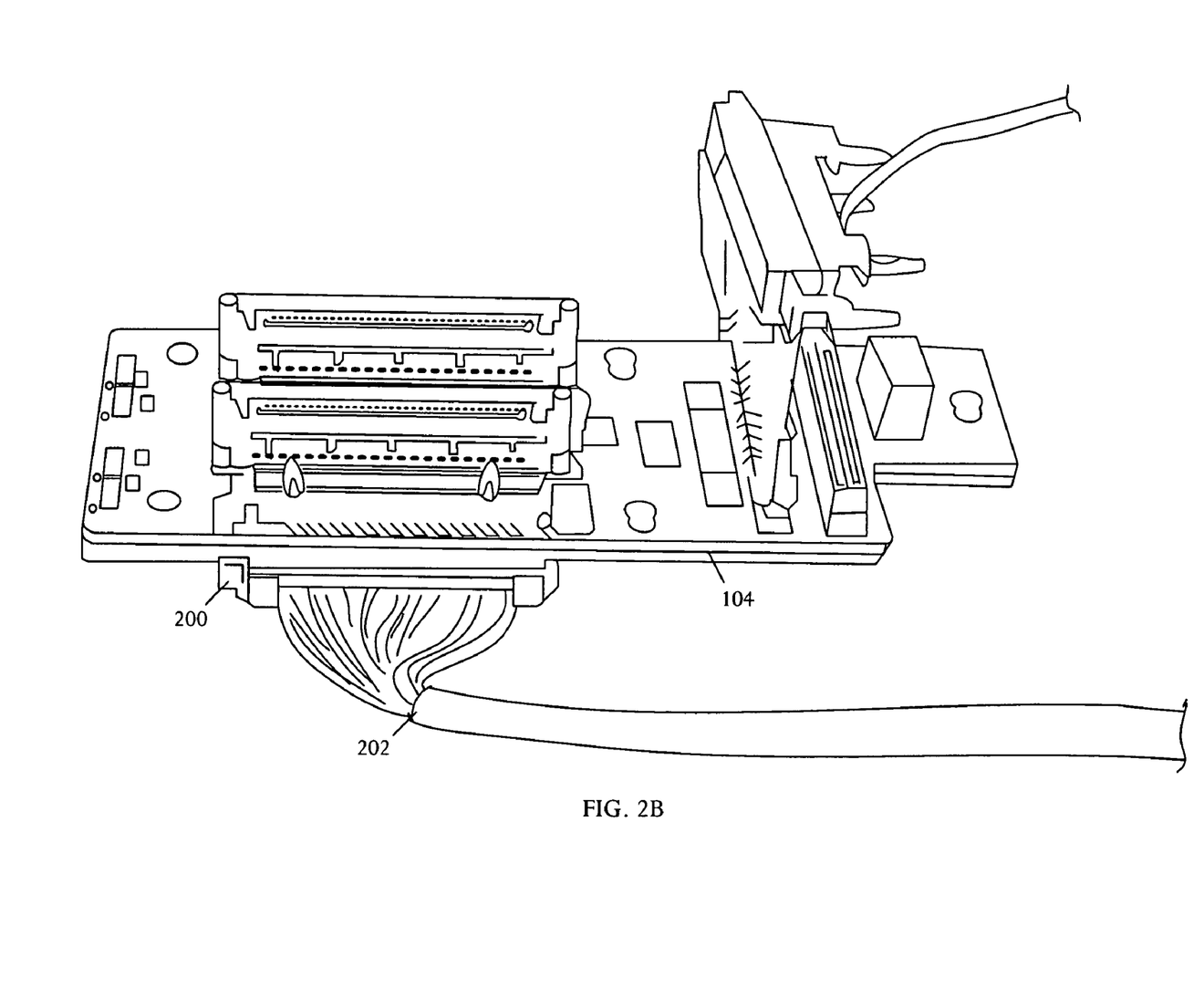

Referring to FIGS. 2A and 2B, pictorial diagrams illustrating rear and front views of a printed circuit assembly 104 that can be held using an embodiment of the toolless lock assembly 102. Connectors 200 mounted on the printed circuit assembly 104 receive a cable 202 that supplies signal connections to the electronic device 100.

Figure 3:
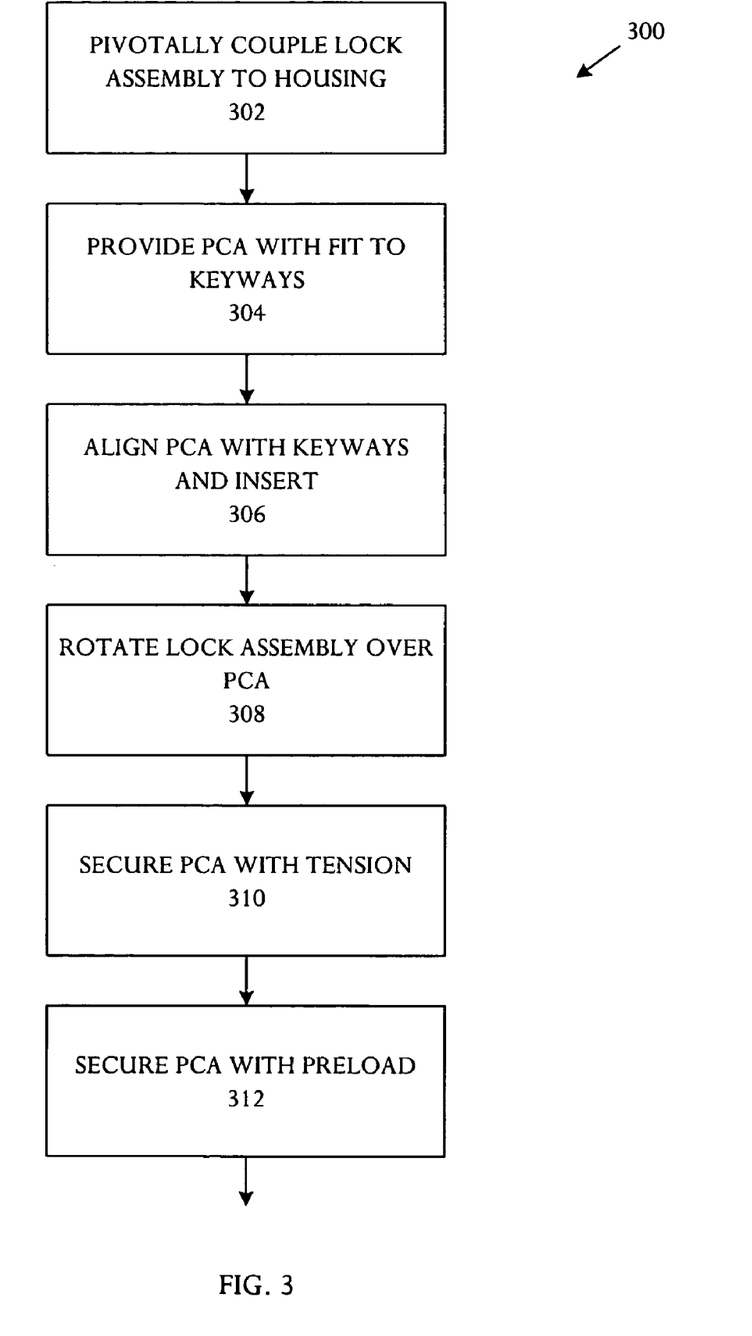
FIG. 3 is a flow chart illustrating a method of assembling or configuring a hard disk drive.

Referring to FIG. 3, a flow chart depicts a method for securing a printed circuit assembly to an electronic device 300. The method comprises coupling a lock assembly to a housing 302 so that the lock assembly can be rotated through an extended position and a retracted position, and providing a printed circuit assembly configuration 304 that is capable of fitting over keyways attached to the housing. The method further comprises installing the printed circuit assembly in alignment with the keyways 306 with the lock assembly in the retracted position. The lock assembly is rotated over the printed circuit assembly 308, securing the printed circuit assembly Typically, the lock member is constructed from a rigid but flexible material such as sheet metal to produce a tension that snaps the lock assembly into place 310 over the printed circuit assembly to hold the printed circuit assembly in place. Accordingly, the lock member applies a preload to the printed circuit assembly 312 with a detent in the printed circuit board that secures the printed circuit assembly to the housing.

The printed circuit assembly locks into place using a single piece lock assembly that is integral with the housing so that no additional parts or hardware are used to secure the printed circuit assembly.

The illustrative method describes a technique for affixing a hard disk drive printed circuit assembly to a hard drive cage. The same method can be used to secure any type of assembly to a housing, chassis, or cage.

While the present disclosure describes various embodiments, these embodiments are to be understood as illustrative and do not limit the claim scope. Many variations, modifications, additions and improvements of the described embodiments are possible. For example, those having ordinary skill in the art will readily implement the steps necessary to provide the structures and methods disclosed herein, and will understand that the process parameters, materials, and dimensions are given by way of example only. The parameters, materials, and dimensions can be varied to achieve the desired structure as well as modifications, which are within the scope of the claims. Variations and modifications of the embodiments disclosed herein may also be made while remaining within the scope of the following claims. For example, the specific examples of electronic devices described herein are hard drives or hard disk drives. The disclosed systems, devices, and methods may be used with any suitable electronic devices.

What is claimed is:

1. An apparatus comprising:
   a lock assembly adapted to secure a printed circuit assembly to a storage drive housing comprising:
   a plurality of keyways extending from a planar side of the storage drive housing and configured to mount the printed circuit assembly parallel to the storage drive housing planar side;
   a pivot coupled to the storage drive housing; and
   a lock member coupled to storage drive housing at the pivot and adapted to rotate over and snap into a detent in the printed circuit assembly to hold the printed circuit assembly in place.

2. The lock assembly according to claim 1 wherein:
   the lock member is constructed from sheet metal.

3. The lock assembly according to claim 1 wherein:
   the lock member couples to the storage drive housing only at the pivot and is resilient so that the lock assembly applies a pre-load to the printed circuit assembly.

4. The lock assembly according to claim 1 wherein:
the lock assembly affixes to the storage drive housing in absence additional parts or hardware for securing the printed circuit assembly.

5. The lock assembly according to claim 1 wherein:
the keyway plurality is configured to fit into apertures in the printed circuit assembly.

6. The lock assembly according to claim 1 wherein:
the storage drive housing is a hard disk drive housing; and
the printed circuit assembly includes a hard disk drive controller.

7. An electronic device comprising:
a storage drive housing; and
a look assembly adapted to secure a printed circuit assembly to the storage drive housing, the lock assembly comprising:
 a plurality of keyways extending from a planar side of the storage drive housing and configured to mount the printed circuit assembly parallel to the storage drive housing planar side;
 a pivot coupled to the storage drive housing; and
 a lock member coupled to storage drive housing at the pivot and adapted to rotate over and snap into a detent in the printed circuit assembly to hold the printed circuit assembly in place.

8. The electronic device according to claim 7 further comprising:
the keyway plurality extending perpendicular to the planar side of the storage drive housing and configured to support and seat the printed circuit assembly.

9. The electronic device according to claim 8 further comprising:
the printed circuit assembly having a plurality of apertures contoured to accept respective ones of the keyway plurality and for securement by the lock assembly.

10. The electronic device according to claim 7 wherein:
the lock member is constructed from sheet metal.

11. The electronic device according to claim 7 wherein:
the lock member couples to the storage drive housing only at the pivot and is resilient so that the lock assembly applies a pre-load to the printed circuit assembly.

12. The electronic device according to claim 7 wherein:
the lock assembly attaches to the storage drive housing so that no separate parts or hardware are used to secure the printed circuit assembly.

13. The electronic device according to claim 7 further comprising:
a finger access detail formed into the lock member.

14. The electronic device according to claim 7 wherein:
the storage drive housing is a hard disk drive housing; and
the printed circuit assembly includes a hard disk drive controller.

15. A method for securing a printed circuit assembly to an electronic device comprising:
 coupling a lock assembly to a storage drive housing whereby the lock assembly can be rotated through an extended position and a retracted position;
 providing a printed circuit assembly configuration adapted to mount on keyways coupled to the storage device housing and extending perpendicular to a planar side of the storage device housing;
 inserting the printed circuit assembly in alignment with and supported by the keyways parallel to the storage device housing planar side with the lock assembly in the retracted position; and
 rotating the lack assembly over the printed circuit assembly in a plane perpendicular to the storage device housing planar side and securing the printed circuit assembly.

16. The method according to claim 15 further comprising:
snapping the lock assembly into a detent in the printed circuit assembly to hold the printed circuit assembly in place.

17. The method according to claim 15 further comprising:
locking the printed circuit assembly into place via a single piece lock assembly that is integral with the housing so that no separate parts or hardware are required to secure the printed circuit assembly.

18. The method according to claim 15 further comprising:
preloading the printed circuit assembly via a force applied by lock assembly that secures the printed circuit assembly against the keyways.

19. The method according to claim 15 wherein:
the storage drive housing is a hard disk drive housing; and
the printed circuit assembly includes a hard disk drive controller.

20. A storage drive comprising:
a storage drive housing having a planar side and planar top perpendicular to the planar side;
a printed circuit adapter configured to mount to the storage drive housing planar side;
a storage drive controller mounted to the printed circuit board adapter; and
a lock assembly adapted to secure the printed circuit assembly to the storage drive housing, the lock assembly comprising:
 a plurality of keyways extending perpendicularly from the storage drive housing planar side and configured to mount the printed circuit assembly parallel to the storage drive housing planar side;
 a pivot coupled to the storage drive housing planar top; and
 a lock member coupled to storage drive housing planar top at the pivot and adapted to rotate over and snap into a detent in the printed circuit assembly to hold the printed circuit assembly in place.

* * * * *